United States Patent
Seo

(10) Patent No.: US 10,547,320 B1
(45) Date of Patent: Jan. 28, 2020

(54) INTEGRATED CIRCUIT AND REFERENCE VOLTAGE GENERATION CIRCUIT

(71) Applicant: SK hynix Inc., Gyeonggi-do (KR)

(72) Inventor: Young-Suk Seo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/272,549

(22) Filed: Feb. 11, 2019

(30) Foreign Application Priority Data

Jul. 16, 2018 (KR) .................. 10-2018-0082426

(51) Int. Cl.
*H03M 1/46* (2006.01)
*H03F 3/45* (2006.01)

(52) U.S. Cl.
CPC .......... *H03M 1/46* (2013.01); *H03F 3/45632* (2013.01)

(58) Field of Classification Search
CPC .............................. H03M 1/46; H03F 3/45632
See application file for complete search history.

(56) References Cited

U.S. PATENT DOCUMENTS

| 8,773,174 | B2 * | 7/2014 | Wang | ................. | H03F 3/45183 |
| | | | | | 327/108 |
| 9,780,767 | B2 | 10/2017 | Park | | |
| 2002/0175739 | A1 * | 11/2002 | Sidiropoulos | ....... | H03F 3/45183 |
| | | | | | 327/345 |
| 2008/0224776 | A1 * | 9/2008 | Kanda | .................... | H03K 5/003 |
| | | | | | 330/258 |

FOREIGN PATENT DOCUMENTS

KR 1020180041026 4/2018

* cited by examiner

Primary Examiner — Howard Williams
(74) Attorney, Agent, or Firm — IP & T Group LLP

(57) ABSTRACT

An integrated circuit includes: a first differential buffer suitable for receiving a primary signal through a primary input terminal thereof, and receiving a secondary signal through a secondary input terminal thereof, wherein the secondary signal has a phase opposite to a phase of the primary signal; a second differential buffer suitable for receiving a first reference voltage through primary and secondary input terminals thereof; and an operational amplifier suitable for receiving a first common mode voltage of the primary and secondary output terminals of the first differential buffer and a second common mode voltage of the primary and secondary output terminals of the second differential buffer, to output the first reference voltage.

16 Claims, 3 Drawing Sheets

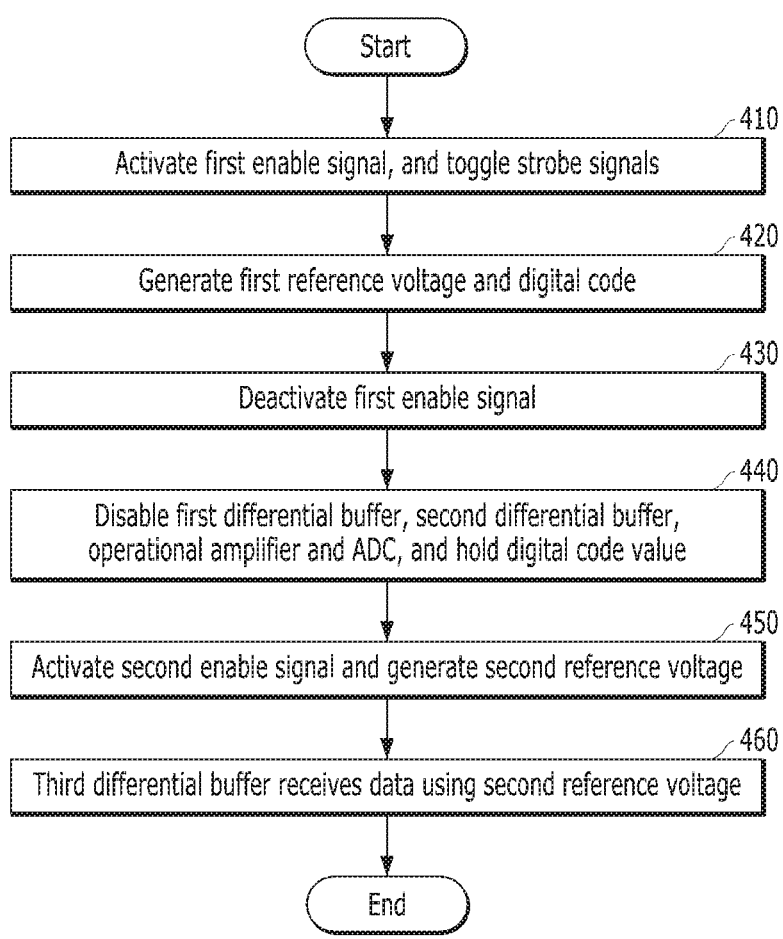

INTEGRATED CIRCUIT AND REFERENCE VOLTAGE GENERATION CIRCUIT

CROSS-REFERENCE TO RELATED APPLICATION

This application claims priority under 35 U.S.C. § 119 to Korean Patent Application No. 10-2018-0082426 filed on Jul. 16, 2018, which is incorporated herein by reference in its entirety.

BACKGROUND

1. Field

Exemplary embodiments of the present invention relate to an integrated circuit, and more particularly, to a differential input buffer and a reference voltage generation circuit.

2. Discussion of the Related Art

FIG. 1 illustrates a conventional differential buffer 100, and FIGS. 2A and 2B illustrate waveforms of signals of the differential buffer 100 shown in FIG. 1. An input signal IN may have various patterns. For convenience of description, however, FIGS. 2A and 2B illustrate the input signal as having the same pattern as a clock, in which a logic high level 'H' and a logic low level 'L' are alternately repeated.

Referring to FIG. 1, the differential buffer 100 generates an output signal OUT by comparing a voltage level of the input signal IN to a reference voltage VREF. The differential buffer 100 generates the output signal OUT at a logic high level when a voltage level of the input signal IN is higher than a level of the reference voltage VREF, and generates the output signal OUT at a logic low level when a voltage level of the input signal IN is lower than a level of the reference voltage VREF.

FIG. 2A illustrates waveforms of the signals IN, VREF and OUT which are inputted to/outputted from the differential buffer 100 when a level of the reference voltage VREF is relatively low. FIG. 2A shows that, as a level of the reference voltage VREF becomes low, a high pulse width of the output signal OUT increases, and a low pulse width of the output signal OUT decreases. In this case, the data eye widens when the output signal OUT is at a logic high, but narrows when the output signal OUT is at a logic low level. Thus, a complication may occur in recognizing the output signal OUT of the differential buffer 100.

FIG. 2B illustrates waveforms of the signals IN, VREF and OUT when a level of the reference voltage VREF is relatively high. FIG. 2B shows that, as a level of the reference voltage VREF becomes high, a low pulse width of the output signal OUT increases, and a high pulse width of the output signal OUT decreases. In this case, the data eye widens when the output signal OUT is at a logic low level, but narrows when the output signal OUT is at a logic high. Thus, complications in recognizing the output signal OUT also may occur.

In the differential buffer 100 which receives the input signal IN through the method of comparing a level of the reference voltage VREF and a voltage level of the input signal IN, a level of the reference voltage VREF serves as a critical factor to determine the quality (i.e., signal integrity) of the output signal OUT of the differential buffer 100.

SUMMARY

Various embodiments of the present invention are directed to a technique for rapidly generating a reference voltage having an optimal level, which is used for receiving a signal.

In an embodiment of the present invention, an integrated circuit may include: a first differential buffer suitable for receiving a primary signal through a primary input terminal thereof, and receiving a secondary signal through a secondary input terminal thereof, wherein the secondary signal has a phase opposite to a phase of the primary signal; a second differential buffer suitable for receiving a first reference voltage through primary and secondary input terminals thereof; and an operational amplifier suitable for receiving a first common mode voltage of the primary and secondary output terminals of the first differential buffer and a second common mode voltage of the primary and secondary output terminals of the second differential buffer, to output the first reference voltage.

In an embodiment of the present invention, a reference voltage generation circuit may include: a first differential buffer suitable for receiving a primary signal and a secondary signal, and outputting a first common mode voltage, wherein the secondary signal has a phase opposite to a phase of the primary signal; a second differential buffer suitable for receiving a first reference voltage through primary and secondary input terminals, and outputting a second common mode voltage; an operational amplifier suitable for comparing the first common mode voltage and the second common mode voltage to output the first reference voltage; an analog-to-digital converter (ADC) suitable for analog-to-digital converting the first reference voltage to generate a digital code; and a digital-to-analog converter (DAC) suitable for digital-analog converting the digital code to generate a second reference voltage.

BRIEF DESCRIPTION OF THE DRAWINGS

FIG. 4 is a flowchart for describing an operation of the integrated circuit shown in FIG. 3.

DETAILED DESCRIPTION

Figure 1:
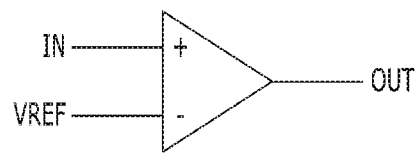
FIG. 1 is a diagram of a conventional differential buffer.
Figure 2A:
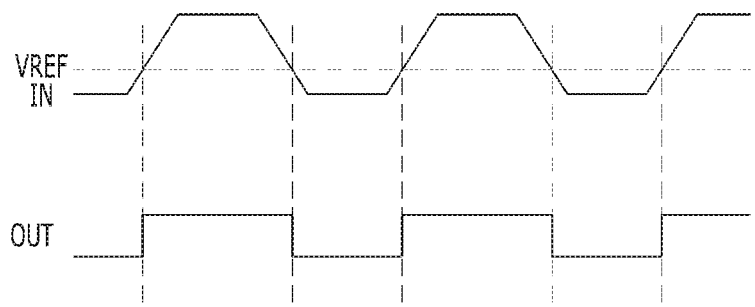
FIGS. 2A and 2B are timing diagrams for describing an operation of the differential buffer shown in FIG. 1.
Figure 2B:
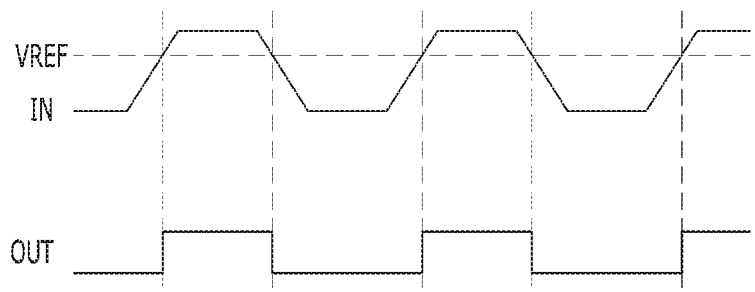

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
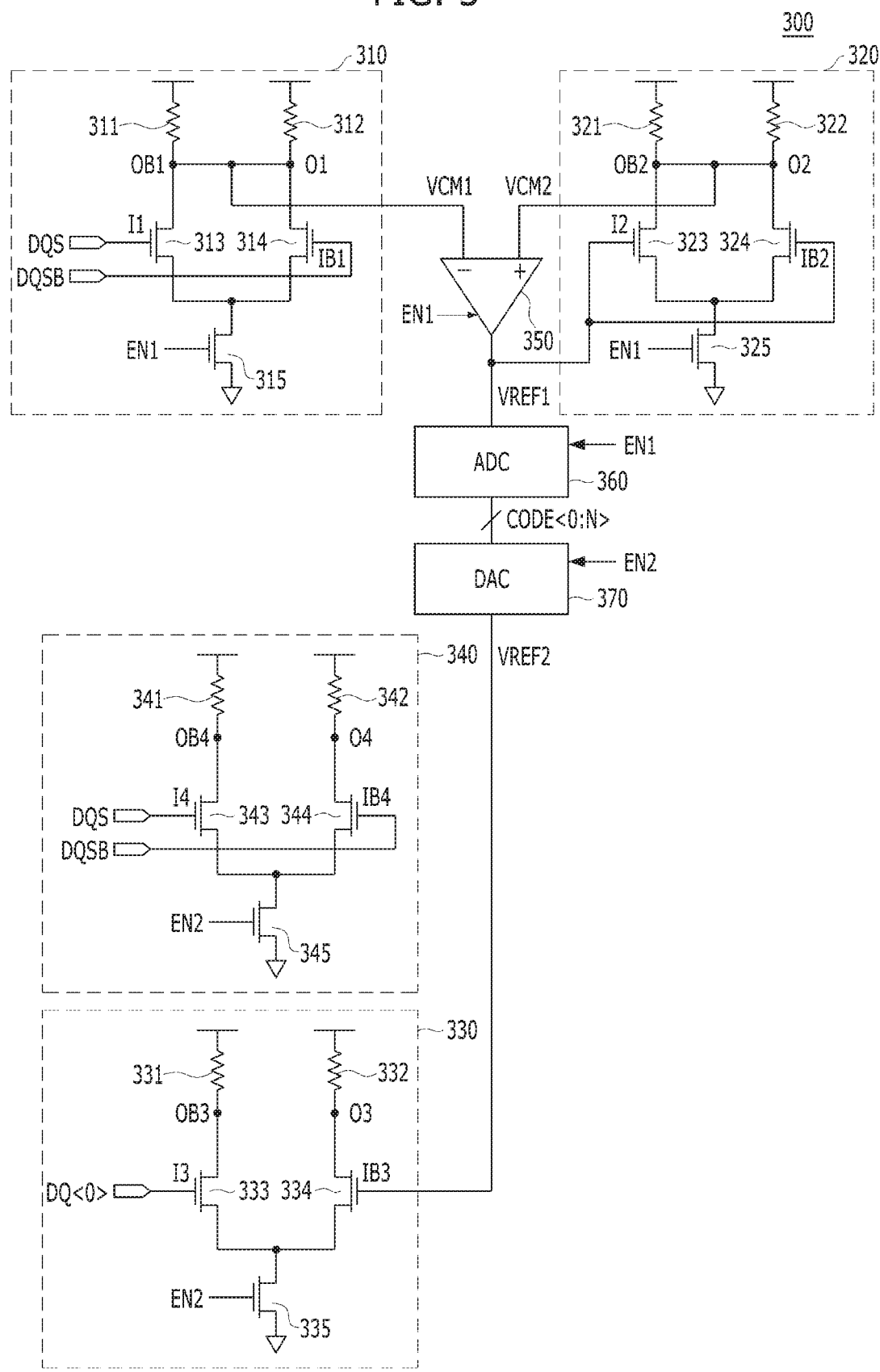
FIG. 3 is a diagram illustrating an integrated circuit in accordance with an embodiment of the present invention.

FIG. 3 is a diagram illustrating an integrated circuit 300 in accordance with an embodiment of the present invention.

Referring to FIG. 3, the integrated circuit 300 may include first to fourth differential buffers 310 to 340, an operational amplifier 350, an analog-to-digital converter (ADC) 360 and a digital-to-analog converter (DAC) 370.

The first differential buffer 310, the second differential buffer 320 and the operational amplifier 350 may serve to generate a first reference voltage VREF1. The ADC 360 and the DAC 370 may serve to store a level of the first reference voltage VREF1 in the form of a digital code CODE<0:N>, and to generate a second reference voltage VREF2 having a level corresponding to the digital code CODE<0:N>. The third differential buffer 330 may serve to receive data DQ<0> based on the second reference voltage VREF2, and the fourth differential buffer 340 may serve to receive data strobe signals DQS and DQSB. Further, the first differential buffer 310, the second differential buffer 320, the operational amplifier 350, the ADC 360 and the DAC 370 may serve as a reference voltage generation circuit used for a differential input buffer.

The first differential buffer 310 may receive a primary data strobe signal DQS through a primary input terminal I1, and receive a secondary data strobe signal DQSB through a secondary input terminal IB1. The secondary data strobe signal DQSB may have a phase opposite to a phase of the primary data strobe signal DQS. When a primary output terminal O1 and a secondary output terminal OB1 are not electrically coupled to each other, the first differential buffer 310 may amplify a voltage difference between the primary data strobe signal DQS and the secondary data strobe signal DQSB, and output the amplified signal through the primary output terminal O1 and the secondary output terminal OB1. Here, since the primary output terminal O1 and the secondary output terminal OB1 are electrically coupled to each other, a first common mode voltage VCM1 may be outputted through the primary output terminal O1 and the secondary output terminal OB1. The first common mode voltage VCM1 may indicate a common mode voltage of a voltage level of the primary output terminal O1 and a voltage of the secondary output terminal OB1. The first differential buffer 310 may include two resistors 311 and 312 and three NMOS transistors 313, 314 and 315. The first differential buffer 310 may be enabled/disabled in response to a first enable signal EN1. The first differential buffer 310 having such configuration may be referred to as a current mode logic (CML) buffer.

The second differential buffer 320 may have a configuration similar to the first differential buffer 310, receive a first reference voltage VREF1 through a primary input terminal I2, and receive the first reference voltage VREF1 through a secondary input terminal IB2. The second differential buffer 320 may include a primary output terminal O2 and a secondary output terminal OB2 which are electrically coupled to each other. A second common mode voltage VCM2 may be outputted through the primary output terminal O2 and the secondary output terminal OB2. The second differential buffer 320 may be enabled/disabled by the first enable signal EN1.

The operational amplifier 350 may receive the first common mode voltage VCM1 from the primary and secondary output terminals O1 and OB1 of the first differential buffer 310 through a negative input terminal (−) thereof, receive the second common mode voltage VCM2 from the primary and secondary output terminals O2 and OB2 of the second differential buffer 320 through a positive input terminal (+) thereof, and output the first reference voltage VREF1. When the first common mode voltage VCM1 has a higher level than the second common mode voltage VCM2, the operational amplifier 350 may lower a level of the first reference voltage VREF1. When a level of the first reference voltage VREF1 is lowered, the NMOS transistors 323 and 324 of the second differential buffer 320 may be turned on weakly. As a result, the second common mode voltage VCM2 may rise. On the other hand, when the second common mode voltage VCM2 has a higher level than the first common mode voltage VCM1, the operational amplifier 350 may raise a level of the first reference voltage VREF1. When a level of the first reference voltage VREF1 is raised, the NMOS transistors 323 and 324 of the second differential buffer 320 may be turned on strongly. As a result, the second common mode voltage VCM2 may fall. Through such an operation, the first common mode voltage VCM1 of the first differential buffer 310 and the second common mode voltage VCM2 of the second differential buffer 320 may become equal to each other. As a result, a level of the first reference voltage VREF1 may also become the common mode level of the primary data strobe signal DQS and the secondary data strobe signal DQSB, that is, the intermediate level. The operational amplifier 350 may be enabled/disabled by the first enable signal EN1.

The ADC 360 may convert a level of the first reference voltage VREF1 into the digital code CODE<0:N>. When the first enable signal EN1 is activated, the ADC 360 may be enabled to convert a level of the first reference voltage VREF1 into the digital code CODE<0:N>. When the first enable signal EN1 is deactivated, the ADC 360 may store and hold the value of the digital code CODE<0:N>. The ADC 360 may include a successive approximation register (SAR) ADC or another type of ADC.

The DAC 370 may reconvert the digital code CODE<0:N> into a second reference voltage VREF2 as an analog value. Since the digital value obtained by converting the first reference voltage VREF1 is the digital code CODE<0:N> and the analog value obtained by reconverting the digital code CODE<0:N> is the second reference voltage VREF2, the second reference voltage VREF2 may have substantially the same level as the first reference voltage VREF1. Although the components 310 to 330 for generating the first reference voltage VREF1 are disabled when the first enable signal EN1 is deactivated, the ADC 360 and the DAC 370 may continuously store a voltage level of the generated first reference voltage VREF1 in the form of the digital code CODE<0:N>, and the stored voltage level may be used to generate the second reference voltage VREF2 having the same level as the stored voltage level. The DAC 370 may be enabled/disabled by a second enable signal EN2.

The third differential buffer 330 may have a configuration similar to the first differential buffer 310, except that a primary output terminal O3 and a secondary output terminal OB3 thereof are isolated from each other. The third differential buffer 330 may receive data DQ<0> through a primary input terminal I3, and receive the second reference voltage VREF2 through a secondary input terminal IB3. The third differential buffer 330 may compare the voltage levels of the data DQ<0> and the second reference voltage VREF2 which are the input signals, and output the comparison result through the primary output terminal O3 and the secondary output terminal OB3. The second reference voltage VREF2 may have a common mode value of the data strobe signals DQS and DQB, and the common mode value may be equal to a median value between high and low voltage values of the data DQ<0>. Therefore, the third differential buffer 330 may correctly receive the data DQ<0> based on the second reference voltage VREF2. The third differential buffer 330 may be enabled/disabled by the second enable signal EN2. FIG. 3 illustrates only one third of the differential buffer 330, but the integrated circuit 300 may include a plurality of differential buffers to receive data based on the second reference voltage VREF2, like the third differential buffer 330. For example, when the integrated circuit 300 is a memory device, the memory device may include 16 data pads for receiving data and 16 third differential buffers for receiving data. Further, although when the second reference voltage VREF2 is used for receiving data is described as an example, the second reference voltage VREF2 may also be used for receiving various signals such as command, address and the like.

The fourth differential buffer 340 may have a configuration similar to the third differential buffer 330. The fourth differential buffer 340 may receive the primary data strobe signal DQS through a primary input terminal I4, and may receive the secondary data strobe signal DQSB through a secondary input terminal IB4. The fourth differential buffer 340 may compare the voltage levels of the data strobe signals DQS and DQSB, and output the comparison result through a primary output terminal O4 and a secondary output terminal OB4. As a result, the primary data strobe signal DQS and the secondary data strobe signal DQSB, which are received by the fourth differential buffer 340, may be outputted through the primary output terminal O4 and the secondary output terminal OB4. The data strobe signals DQS and DQSB received by the fourth differential buffer 340 may be used to strobe the data DQ<0> received by the third differential buffer 330. The fourth differential buffer 340 may be enabled/disabled by the second enable signal EN2.

The elements included in the first to fourth differential buffers 310 to 340 may be designed to have the same size. For example, the resistors 311 and 312 used in the first differential buffer 310 may be designed to have the same size as the resistors 321, 322, 331, 332, 341 and 342 used in the second to fourth differential buffers 320 to 340, and the NMOS transistor 313 used in the first differential buffer 310 may be designed to have the same size as the NMOS transistors 323, 333 and 343 used for the second to fourth differential buffers 320 to 340.

FIG. 4 is a flowchart illustrating an operation of the integrated circuit 300 shown in FIG. 3. Referring to FIGS. 3 and 4, the operation of the integrated circuit 300 will be described.

First, the first enable signal EN1 may be activated, and the primary data strobe signal DQS and the secondary data strobe signal DQSB may toggle at step 410. The first enable signal EN1 may be activated during a reference voltage generation period for generating the first reference voltage VREF1. Since the first reference voltage VREF1 needs to be generated before the integrated circuit 300 receives the data DQ<0>, the reference voltage generation period may be included in an initialization period of the integrated circuit 300. In order to generate the first reference voltage VREF1 as a correct value, the data strobe signals DQS and DQSB need to toggle during the reference voltage generation period. When the first enable signal EN1 is activated, the first differential buffer 310, the second differential buffer 320, the operational amplifier 350 and the ADC 360 may be enabled.

Through the operations of the first differential buffer 310, the second differential buffer 320 and the operational amplifier 350, the first reference voltage VREF1 may have the optimal value corresponding to the common mode voltage (i.e., VCM1) of the data strobe signals DQS and DQSB, and the ADC 360 may convert a level of the first reference voltage VREF1 into the digital code CODE<0:N> at step 420.

Then, the first enable signal EN1 may be deactivated, and the data strobe signals DQS and DQSB may be deactivated at step 430. When the data strobe signals DQS and DQSB are deactivated, it may indicate that the data strobe signals DQS and DQSB do not toggle.

In response to the deactivation of the first enable signal EN1, the first differential buffer 310, the second differential buffer 320, the operational amplifier 350 and the ADC 360 may be disabled at step 440. Although the ADC does not perform the analog-to-digital conversion any more when the first enable signal EN1 is deactivated, the ADC 360 may hold the value of the digital code CODE<0:N> such that the value of the digital code CODE<0:N> is retained.

Before the data DQ<0> is inputted to the integrated circuit 300, the second enable signal EN2 may be activated at step 450. In response to the activation of the second enable signal EN2, the third differential buffer 330, the fourth differential buffer 340 and the DAC 370 may be enabled. The DAC 370 may generate the second reference voltage VREF2 by digital-analog converting the digital code CODE<0:N> held by the ADC 360.

Then, the third differential buffer 330 may receive the data DQ<0> based on the second reference voltage VREF2 at step 460. The fourth differential buffer 450 may receive the data strobe signals DQS and DQSB, and the data strobe signals DQS and DQSB may be used to strobe the data DQ<0> received by the third differential buffer 330.

In the present embodiment, it has been described that the signals received by the first and fourth differential buffers 310 and 340 are the data strobe signals DQS and DQSB. However, other signals may be used instead of the data strobe signals DQS and DQSB, if the other signals are toggling differential signals. For example, clock signals CK and CKB (not illustrated) may be used instead of the data strobe signals DQS and DQSB.

In accordance with the embodiments of the present invention, the integrated circuit may rapidly generate the reference voltage having an optimal level.

Although various embodiments have been described for illustrative purposes, it will be apparent to those skilled in the art that various changes and modifications may be made without departing from the spirit and scope of the invention as defined in the following claims.

What is claimed is:

1. An integrated circuit comprising:
a first differential buffer suitable for receiving a primary signal through a primary input terminal thereof, and receiving a secondary signal through a secondary input terminal thereof, wherein the secondary signal has a phase opposite to a phase of the primary signal;
a second differential buffer suitable for receiving a first reference voltage through primary and secondary input terminals thereof; and
an operational amplifier suitable for receiving a first common mode voltage of the primary and secondary output terminals of the first differential buffer and a second common mode voltage of the primary and secondary output terminals of the second differential buffer, to output the first reference voltage.

2. The integrated circuit of claim 1, further comprising:
an analog-to-digital converter (ADC) suitable for analog-to-digital converting the first reference voltage to generate a digital code; and
a digital-to-analog converter (DAC) suitable for digital-to-analog converting the digital code to generate a second reference voltage.

3. The integrated circuit of claim 2, further comprising a third differential buffer suitable for receiving an input signal based on the second reference voltage.

4. The integrated circuit of claim 3, further comprising a fourth differential buffer suitable for receiving the primary signal through a primary input terminal thereof, and receiving the secondary signal through a secondary input terminal thereof.

5. The integrated circuit of claim 4, wherein the primary signal and the secondary signal comprise data strobe signals or clock signals.

6. The integrated circuit of claim 5, wherein the input signal comprises data.

7. The integrated circuit of claim 3, wherein the first differential buffer, the second differential buffer and the operational amplifier are enabled in a reference voltage generation period, and the ADC holds a value of the digital code when the reference voltage generation period ends.

8. The integrated circuit of claim 7, wherein the primary and secondary signals toggle in the reference voltage generation period.

9. The integrated circuit of claim 7, wherein the reference voltage generation period is included in the initial period of the operation of the integrated circuit.

10. The integrated circuit of claim 4, wherein each of the first to fourth differential buffers comprises a current mode logic (CML) buffer.

11. The integrated circuit of claim 2, wherein the ADC comprises a successive approximation register (SAR) ADC.

12. The integrated circuit of claim 7, wherein the input signal is received after the reference voltage generation period ends.

13. A reference voltage generation circuit comprising:
a first differential buffer suitable for receiving a primary signal and a secondary signal, and outputting a first common mode voltage, wherein the secondary signal has a phase opposite to a phase of the primary signal;
a second differential buffer suitable for receiving a first reference voltage through primary and secondary input terminals, and outputting a second common mode voltage;
an operational amplifier suitable for comparing the first common mode voltage and the second common mode voltage to output the first reference voltage;
an analog-to-digital converter (ADC) suitable for analog-to-digital converting the first reference voltage to generate a digital code; and
a digital-to-analog converter (DAC) suitable for digital-analog converting the digital code to generate a second reference voltage.

14. The reference voltage generation circuit of claim 13, wherein the primary and secondary signals are data strobe signals or clock signals.

15. The reference voltage generation circuit of claim 13, wherein the DAC is enabled after the first differential buffer, the second differential buffer, the operational amplifier and the ADC are disabled.

16. The reference voltage generation circuit of claim 14, wherein the second reference voltage is used for a differential input buffer.

* * * * *